(12) United States Patent
Park et al.

(10) Patent No.: US 9,599,309 B2
(45) Date of Patent: Mar. 21, 2017

(54) DISPLAY DEVICE AND METHOD OF MANUFACTURING THE SAME

(71) Applicants: Hye-Jung Park, Yongin (KR); Soon-Ryong Park, Yongin (KR); Woo-Suk Jung, Yongin (KR); Seok-Gi Baek, Yongin (KR); Tae-Eun Kim, Yongin (KR)

(72) Inventors: Hye-Jung Park, Yongin (KR); Soon-Ryong Park, Yongin (KR); Woo-Suk Jung, Yongin (KR); Seok-Gi Baek, Yongin (KR); Tae-Eun Kim, Yongin (KR)

(73) Assignee: SAMSUNG DISPLAY CO., LTD., Yongin, Gyunggi-Do (KR)

( * ) Notice: Subject to any disclaimer, the term of this patent is extended or adjusted under 35 U.S.C. 154(b) by 151 days.

(21) Appl. No.: 13/675,243

(22) Filed: Nov. 13, 2012

(65) Prior Publication Data
US 2013/0343063 A1 Dec. 26, 2013

(30) Foreign Application Priority Data
Jun. 20, 2012 (KR) .......................... 10-2012-0066323

(51) Int. Cl.
*F21V 3/00* (2015.01)
*F21V 5/00* (2015.01)
*F21V 5/04* (2006.01)
*H01L 51/52* (2006.01)

(52) U.S. Cl.
CPC ................ *F21V 5/00* (2013.01); *F21V 5/045* (2013.01); *H01L 51/5275* (2013.01); *H01L 51/524* (2013.01); *Y10T 29/49002* (2015.01)

(58) Field of Classification Search
CPC . F21V 5/00; F21V 5/045; F21V 5/002; F21V 5/004
USPC ... 362/311.05, 311.01, 311.1, 326, 335, 558, 362/610, 616, 618, 619, 624, 625, 97.2
See application file for complete search history.

(56) References Cited

U.S. PATENT DOCUMENTS

| | | | |
|---|---|---|---|
| 7,905,650 B2 * | 3/2011 | Ma et al. | 362/615 |
| 7,986,388 B2 * | 7/2011 | Harada | 349/122 |
| 2003/0184993 A1 * | 10/2003 | Yamada | 362/31 |
| 2009/0135335 A1 * | 5/2009 | Lee | G02B 5/045 349/64 |
| 2010/0165603 A1 * | 7/2010 | Sun et al. | 362/97.2 |
| 2012/0002397 A1 * | 1/2012 | Iwata et al. | 362/97.1 |

(Continued)

FOREIGN PATENT DOCUMENTS

| | | |
|---|---|---|
| JP | 11-074072 A | 3/1999 |
| JP | 2004-342448 A | 4/2004 |

(Continued)

OTHER PUBLICATIONS

Taiwanese Search Report dated May 25, 2016 in Corresponding Taiwanese Patent Application No. 101149292.

*Primary Examiner* — Ali Alavi
(74) *Attorney, Agent, or Firm* — Lee & Morse, P.C.

(57) ABSTRACT

A display device includes a first substrate, a light emission portion on the first substrate, a second substrate separated by a predetermined distance from the light emission portion, and a refractive layer on the second substrate, the refractive layer facing the light emission portion and being configured to change an optical path of light emitted from the light emission portion.

20 Claims, 2 Drawing Sheets

(56) References Cited

U.S. PATENT DOCUMENTS

2012/0170282 A1* 7/2012 Lin et al. ...................... 362/341

FOREIGN PATENT DOCUMENTS

| | | |
|---|---|---|
| JP | 2004-127662 A | 12/2004 |
| JP | 2006-083008 A | 3/2006 |
| KR | 10-2009-0020790 A | 2/2009 |
| KR | 10-2010-0090497 A | 8/2010 |
| KR | 10-2011-0012243 A | 2/2011 |

* cited by examiner

DISPLAY DEVICE AND METHOD OF MANUFACTURING THE SAME

CROSS-REFERENCE TO RELATED PATENT APPLICATION

This application claims the benefit of priority under 35 U.S.C. §119 to Korean Patent Application No. 10-2012-0066323, filed on Jun. 20, 2012, in the Korean Intellectual Property Office, the disclosure of which is incorporated herein in its entirety by reference.

BACKGROUND

1. Field

Example embodiments relate to a display device and to a method of manufacturing the display device, and more particularly, to a display device with an improved viewing angle and to a method of manufacturing the display device.

2. Description of the Related Art

In general, display devices may include various structures for ensuring various viewing angles. In particular, as large display devices are being commercialized, it becomes very important to ensure wide viewing angles. In order to ensure various viewing angles of the display devices, various technologies are being developed.

SUMMARY

Example embodiments provide a display device with a refractive layer on a substrate in order to improve the viewing angle of the display device.

Example embodiments also provide a method of manufacturing a display device with a refractive layer on a substrate in order to improve the viewing angle of the display device.

According to an aspect of the example embodiments, there is provided a display device, including a first substrate, a light emission portion on the first substrate, a second substrate separated by a predetermined distance from the light emission portion, and a refractive layer on the second substrate, the refractive layer facing the light emission portion and being configured to change an optical path of light emitted from the light emission portion.

The refractive layer may include refractive protrusions, the refractive protrusions being shaped as convex lenses and including a same material as the second substrate.

The refractive layer may include a bead layer on the second substrate, the bead layer including sprayed beads, and a protective layer on the bead layer.

The beads may include at least one of glass powder, silica, and ceramic.

The protective layer may include at least one of epoxy and silicon.

The protective layer may have a refractive index lower than a refractive index of the second substrate.

The refractive index of the protective layer may be 1.5 or less.

Each of the beads may have a diameter of about 3 μm to about 5 μm.

A haze of the beads sprayed on the second substrate may range from about 30% to about 50%.

According to another aspect of the example embodiments, there is provided a method of manufacturing a display device, including forming a light emission portion on a first substrate, forming a refractive layer on a second substrate, and attaching the first substrate to the second substrate, such that the refractive layer faces the light emission portion.

Forming the refractive layer may include coating a surface of the second substrate with glass powder, and etching the coated surface of the second substrate.

Forming the refractive layer may include forming a bead layer on the first substrate, and forming a protective layer on the bead layer.

Forming the protective layer may include passivating the protective layer by hardening epoxy with ultraviolet (UV) light or with a silicon on glass (SOG) process.

Forming the refractive layer may include forming refractive protrusions of a same material as the second substrate, the refractive protrusions being formed as convex lenses.

BRIEF DESCRIPTION OF THE DRAWINGS

The above and other features and advantages of the example embodiments will become more apparent by describing in detail exemplary embodiments thereof with reference to the attached drawings, in which.

DETAILED DESCRIPTION

Hereinafter, example embodiments will be described more fully with reference to the accompanying drawings, in which example embodiments are shown. Example embodiments may, however, be embodied in many different forms and should not be construed as limited to those set forth herein. Rather, these embodiments are provided so that this disclosure will be thorough and complete, and will fully convey the scope of the invention to those skilled in the art.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

Figure 1:
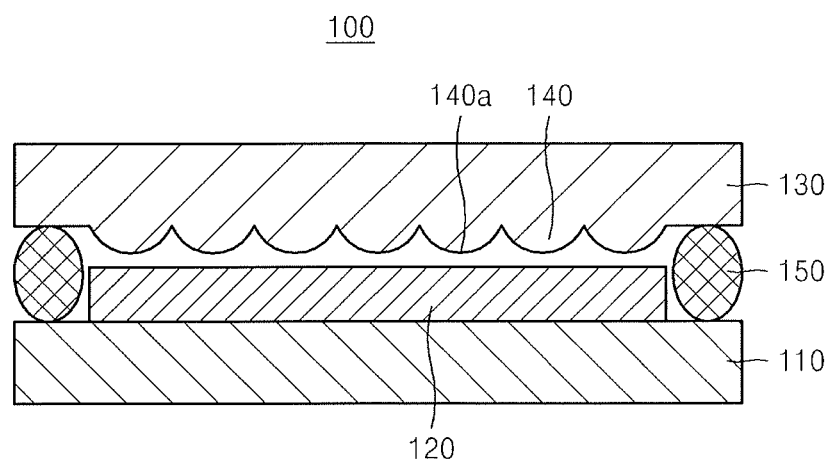
FIG. 1 is a conceptual view of a display device according to an embodiment.
Figure 2:
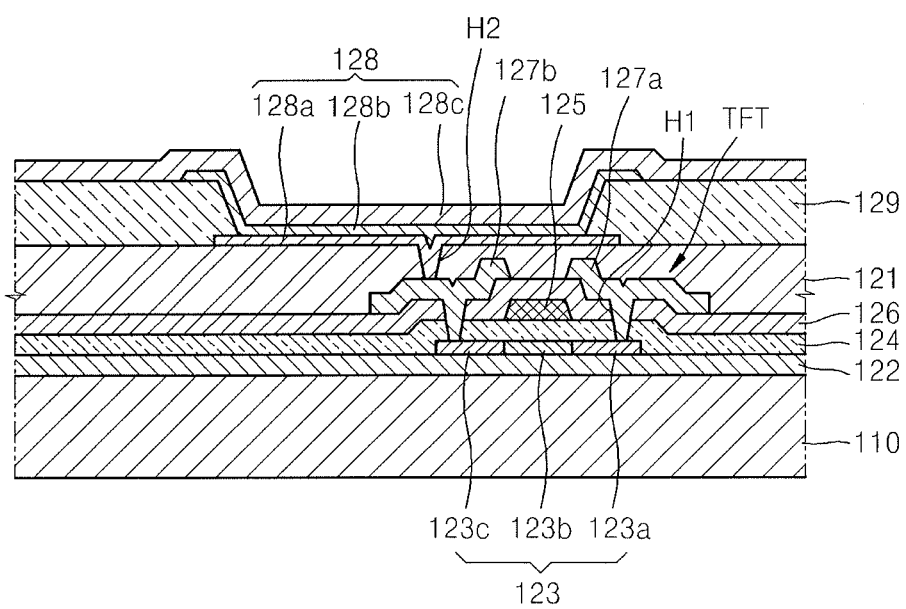
FIG. 2 is a cross-sectional view of a first substrate and a light emission portion shown in FIG. 1.

FIG. 1 is a conceptual view of a display device 100 according to an embodiment. FIG. 2 is an enlarged cross-sectional view of a first substrate 110 and a light emission portion 120 in the display device 100.

Referring to FIGS. 1 and 2, the display device 100 includes the first substrate 110, a second substrate 130, and the light emission portion 120.

The light emission portion 120 may be formed on the first substrate 110. Here, the light emission portion 120 includes thin film transistors (TFTs), a passivation layer 121 covering the TFTs, and an organic light-emitting device (OLED) 128 formed on the passivation layer 121.

The first substrate 110 may be formed of a glass material. However, the example embodiments are not limited thereto, e.g., the first substrate 110 may be formed of a plastic material or a metal material, e.g., SUS and Ti.

A buffer layer 122 formed of an organic compound and/or an inorganic compound is further formed on an upper surface of the first substrate 110. The buffer layer 122 may be formed of, e.g., $SiO_x$ (x≥1) and $SiN_x$ (x≥1).

An active layer 123 arranged in a predetermined pattern is formed on the buffer layer 122. The active layer 123 is buried by a gate insulating layer 124. The active layer 123 includes a source region 123a and a drain region 123c, and further includes a channel region 123b between the source region 123a and the drain region 123c.

The active layer 123 may be formed by forming an amorphous silicon layer on the buffer layer 122, crystallizing the amorphous silicon layer to form a polycrystalline silicon layer, and patterning the polycrystalline silicon layer. The source and drain regions 123a and 123c of the active layer 123 are doped with impurities according to a kind of the TFT, e.g., a driving TFT (not shown) or a switching TFT (not shown).

A gate electrode 125 corresponding to the active layer 123 and an interlayer dielectric 126 burying the gate electrode 125 are formed on an upper surface of the gate insulating layer 124. In addition, contact holes are formed in the interlayer dielectric 126 and the gate insulating layer 124, and after that, a source electrode 127a and a drain electrode 127b are formed on the interlayer dielectric 126 so as to respectively contact the source region 123a and the drain region 123c.

In addition, a reflection layer (not shown) is formed simultaneously with the source and drain electrodes 127a and 127b. The source and drain electrodes 127a and 127b may be formed of a material having good electric conductivity and may have sufficient thickness to reflect light. The source and drain electrodes 127a and 127b may be formed of a metal material, e.g., at least one of Ag, Mg, Al, Pt, Pd, Au, Ni, Nd, Ir, Cr, Li, Ca, and a compound thereof.

A passivation layer 121 is formed on the TFT and the reflection layer formed as above, and a pixel electrode 128a of the OLED 128 is formed on the passivation layer 121. The pixel electrode 128a contacts the drain electrode 127b of the TFT through a via hole H2 formed in the passivation layer 121. The passivation layer 121 may be formed of an inorganic material and/or an organic material to have a single-layer structure or a multi-layered structure. The passivation layer 121 may be formed as a planarization layer having a flat upper surface regardless of curvatures of lower layers, or may be formed to be curved along the curvatures of lower layers. In addition, the passivation layer 121 may be formed of a transparent insulating material so as to achieve a resonance effect.

After forming the pixel electrode 128a on the passivation layer 121, a pixel definition layer 129 is formed of an organic material and/or an inorganic material so as to cover the pixel electrode 128a and the passivation layer 121. An opening that exposes the pixel electrode 128a is formed through the pixel definition layer 129.

In addition, an organic emission layer 128b and an opposite electrode 128c are formed at least on the pixel electrode 128a. The pixel electrode 128a functions as an anode and the opposite electrode 128c functions as a cathode, and the pixel electrode 128a and the opposite electrode 128c may have opposite polarities.

The pixel electrode 128a may be formed of a material having a high work function. For example, the pixel electrode 128a may be formed of a transparent conductive material, e.g., indium tin oxide (ITO), indium zinc oxide (IZO), indium oxide ($In_2O_3$), and zinc oxide (ZnO).

The opposite electrode 128c may be formed of a metal material having a low work function. For example, the opposite electrode 128c may be formed of at least one of Ag, Mg, Al, Pt, Pd, Au, Ni, Nd, Ir, Cr, Li, Ca, and a compound thereof. In another example, the opposite electrode 128c may be formed of at least one of Mg, Ag, and Al to have a small thickness so as to function as a semi-transmissive reflection layer. Thus, the opposite electrode 128c optically resonates to transmit light.

The pixel electrode 128a and the opposite electrode 128c are insulated from each other by the organic emission layer 128b, and apply voltages of different polarities to the organic emission layer 128b so that the organic emission layer 128b emits light.

The organic emission layer 128b may be formed of a low-molecular weight organic material or a high-molecular weight organic material. If the low-molecular weight organic material is used, then the organic emission layer 128b may have a single or multi-layer structure including at least of a hole injection layer (HIL), a hole transport layer (HTL), an emission layer (EML), an electron transport layer (ETL), and an electron injection layer (EIL). Examples of suitable organic materials may include copper phthalocyanine (CuPc), N,N-di(naphthalene-1-yl)-N,N'-diphenyl-benzidine (NPB), tris-8-hydroxyquinoline aluminum (Alq3), and the like. Such a low-molecular weight organic material may be deposited by vacuum deposition. For example, the HIL, the HTL, the ETL, and the EIL are common layers that may be applied commonly to red, green, and blue pixels. Therefore, unlike FIG. 2, the common layers may be formed to cover all pixels like the opposite electrode 128c.

If a high-molecular weight organic material is used, the organic emission layer 128b may have a structure including the HTL and EML. For example, the HTL may be formed of poly(3,4-ethylenedioxythiophene) (PEDOT), and the EML may be formed of a polymer organic material based on PolyPhenylene Vinylene (PPV) and Polyfluorene in a screen printing method or an inkjet printing method.

The organic emission layer 128b is not limited to the above examples, and other examples may be applied.

The second substrate 130 may be formed similarly to the first substrate 110. In particular, the second substrate 130 may be formed of a glass material, similarly to the first substrate 110. However, example embodiments are not limited thereto, e.g., the second substrate 130 may be formed of a plastic material.

The display device 100 may further include a refractive layer 140 that is formed on, e.g., directly on, the second substrate 130 to change an optical path of the light emitted from the light emission portion 120 toward the second substrate 130. For example, the refractive layer 140 may be formed between the second substrate 130 and the light emission portion 120. The refractive layer 140 may be formed of the same material as that of the second substrate 130, e.g., the refractive layer 140 may be formed integrally with the second substrate 130. For example, the refractive layer 140 may be formed of a glass material when the second substrate 130 is formed of a glass material, or may be formed of a plastic material when the second substrate 130 is formed of a plastic material.

The refractive layer 140 may include refractive protrusions 140a formed as convex lenses. For example, the refractive protrusions 140a may be formed as hemispheres. The refractive protrusions 140a may be formed to protrude from the second substrate 130 toward the light emission portion 120. Here, the plurality of refractive protrusions 140a may be formed on a surface of the second substrate 130 with constant intervals therebetween.

The display device 100 described above may be manufactured as follows. Once the second substrate 130 is prepared, the refractive layer 140 may be formed on the second substrate 130. For example, the second substrate 130 may be formed of a transparent material e.g., glass or plastic material.

When the second substrate 130 is prepared as described above, beads may be sprayed on the second substrate 130. For example, the beads may include glass powder, silica, and/or ceramic. The beads may be sprayed on the second substrate 130 to be coated, e.g., frame-coated, on the second substrate 130. The beads may have a size, i.e., a diameter, ranging from about 1 μm to about 5 μm. If the beads have a size outside the indicated range, the refractive layer 140 may not be formed or a viewing angle may be reduced after formation of the refractive layer 140, thereby reducing display characteristics of the display device 100, e.g., reduce display visibility from side portions of the display device 100.

Also, the beads may form haze on the second substrate 130. The haze may range from about 30% to about 50%. That is, after spraying the beads on the second substrate 130, about 30% to about 50% of light may be transmitted through the second substrate 130. Here, when the haze due to the beads is outside the indicated range, light blurring or twinkling may occur when the display device 100 is operated, thereby degrading visibility.

When spraying the beads on the second substrate 130 is complete, the second substrate 130 may be etched. The second substrate 130 may be etched in any suitable method of etching a glass material or a plastic material, and detailed descriptions are not provided.

When the surface of the second substrate 130 is etched, an etching speed of a portion where the beads are sprayed and an etching speed of a portion where the beads are not sprayed may be different from each other. In particular, a speed of etching the portion where the beads are sprayed on the second substrate 130 may be slower than that of etching the portion where the beads are not sprayed on the second substrate 130. Therefore, due to the above difference between the etching speeds, the etched surface of the second substrate 130 may be uneven, e.g., may have a rough structure.

That is, when etching the second substrate 130, the refractive layer 140 may be formed on the etched surface of the second substrate 130. As described above, the refractive layer 140 may include the refractive protrusions 140a. In particular, when the refractive layer 140 is formed, the beads may be completely removed or a small number of beads may be formed on the refractive protrusions 140a while etching the second substrate 130.

The plurality of refractive protrusions 140a is formed, and each of the refractive protrusions 140a may be formed as a convex lens. The refractive protrusions 140a are separated by predetermined intervals from each other on the surface of the second substrate 130.

When formation of the refractive layer 140 is complete, or while forming the refractive layer 140, the light emission portion 120 may be formed on the first substrate 110. Here, the light emission portion 120 may be formed on the first substrate 110 in the above described manner, and thus, detailed descriptions are not provided. In addition, processes of forming each layer of the light emission portion 120 may be formed in any suitable manner, and thus, detailed descriptions are not provided here.

Next, the first and second substrates 110 and 130 may be attached to each other. Here, the first and second substrates 110 and 130 may be sealed with each other when the refractive layer 140 formed on the second substrate 130 faces the light emission portion 120 formed on the first substrate 110.

The sealing of the first and second substrates 110 and 130 may be performed by applying a sealing agent 150 between the first and second substrates 110 and 120, followed by compressing the first and second substrates 110 and 130. Here, the above process of sealing the first and second substrates 110 and 130 to each other by using the sealing agent 150 is similar to a general sealing process, and thus, detailed descriptions are not provided.

According to the display device 100 manufactured through the above described processes, the visibility of a viewer from side portions of the display device 100 may be improved. In particular, an optical path of light emitted from the light emission portion 120 may vary while passing through the refractive layer 140.

For example, light may be emitted in multi-directions from the light emission portion 120. However, when the light transmits through the refractive layer 140, the optical paths of the light may vary. In particular, the light may be refracted toward side surfaces of the second substrate 130 when passing through the refractive layer 140. The refracted light may be sensed to be straight by the viewer watching the display device 100 from the side of the second substrate 130.

Also, when the viewer watches the light emission portion 120 via the second substrate 130, the point where the viewer watches may be refracted since the light is refracted while passing through the second substrate 130 and the refractive layer 140. In particular, although the viewer watches the display device 100 from the side portion of the second substrate 130, the viewer may feel as if he/she watches each of the pixels formed on the light emission portion 120.

Therefore, the display device 100 may ensure visibility for the viewer even when the viewer watches the display device 100 from side portions. In particular, since the viewer may watch clear images from the side portions of the display device 100, a viewing angle may be improved.

Figure 3:
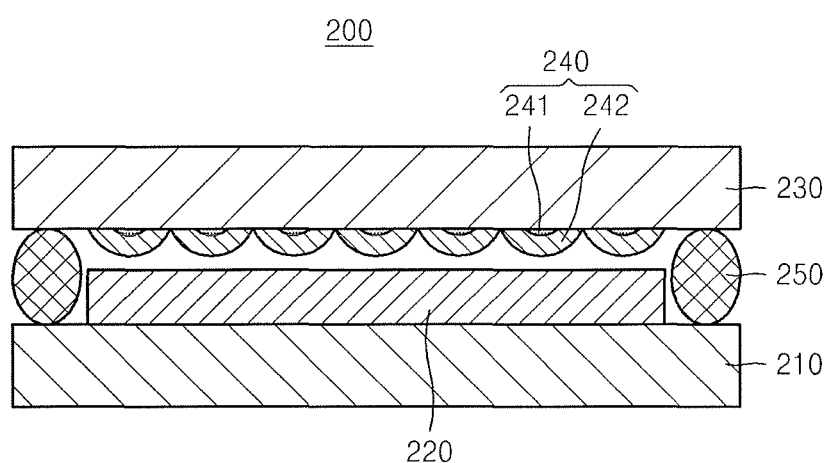
FIG. 3 is a conceptual view of a display device according to another embodiment.

FIG. 3 is a conceptual view of a display device 200 according to another embodiment. Referring to FIG. 3, the display device 200 may include a first substrate 210, a second substrate 230, a light emission portion 220, and a refractive layer 240. Here, since the first substrate 210, the second substrate 230, and the light emission portion 220 are similar to those discussed previously with reference to FIGS. 1-2, detailed descriptions thereof are not provided.

The refractive layer 240 may include a bead layer 241 formed of beads sprayed on the second substrate 230. In other words, instead of etching the sprayed beads into the second surface as in the embodiment of FIG. 1, the beads sprayed on the second substrate 230 remain on the second surface 230 to become a part of the reflective layer 240. The beads may include, e.g., at least one of glass powder, silica, and ceramic.

Also, the refractive layer 240 may include a protective layer 242 foamed on the bead layer 241. The protective layer 242 may be formed of a material having a refractive index that is lower than that of the second substrate 230. In particular, the protective layer 242 may include at least one of epoxy and silicon. In this case, the refractive index of the protective layer 242 may be about 1.5 or less. When the refractive index of the protective layer 242 exceeds 1.5, the light emitted from the light emission portion 220 may not be sufficiently refracted or the light incident from outside may not be sufficiently refracted, thereby not ensuring a viewing angle.

The above display device 200 may be manufactured as follows. First, the bead layer 241 may be formed on the second substrate 230. That is, when the second substrate 230 is prepared, the refractive layer 240 may be formed on the second substrate 230. Here, the beads may be sprayed on the second substrate 230. The beads may have sizes that are similar to those described with respect to the beads of FIGS. 1-2.

In detail, a bead may have a size ranging from about 1 µm to about 5 µm. When the size of the bead exceeds the above range, the refractive layer 240 may not be formed well, so the viewing angle from the side portions of the display device 200 may not be ensured. As described above, the haze of the beads sprayed on the second substrate 230 may range from about 30% to about 50%. Here, when the haze is outside the above range, light blurring or twinkling may occur when the display device 200 is operated, thereby degrading visibility.

Next, the protective layer 242 may be formed on the bead layer. That is, the protective layer 242 may be formed on the second substrate 230 on which the beads are sprayed. Here, the protective layer 242 may include at least one of epoxy and silicon as described above.

The protective layer 242 may be formed in various ways. For example, when the protective layer 242 includes epoxy, the protective layer 242 may be passivated by hardening the protective layer by using ultraviolet (UV) rays, drying at room temperature, or thermal drying. In another example, when the protective layer 242 is formed of silicon, the protective layer 242 may be formed through a silicon on glass (SOG) process, e.g., the SOG process may be performed by a general chemical vapor deposition or a coating method.

When the protective layer 242 is formed, the protective layer 242 may be curved due to the beads in the bead layer 241. Here, since the protective layer 242 partially protrudes due to the beads of the bead layer 241, the protective layer 242 may include convex lens shapes after the curing process. That is, when the above processes are finished, the refractive layer 240 may include refractive protrusions, e.g., as the refractive protrusions 140a in FIGS. 1 and 2.

Next, the light emission portion 220 may be formed on the first substrate 210. The light emission portion 220 may be formed on the first substrate 210, as described above with reference to FIGS. 1-2. Next, the first and second substrates 210 and 230 may be sealed to bond with each other. Here, the sealing process of the first and second substrates 210 and 230 is similar to that described previously with reference to FIGS. 1-2, so detailed descriptions are not provided.

According to the display device 200 manufactured by the above described processes, visibility for a viewer watching the display device 200 from a side portion may be improved. In detail, according to the display device 200, an optical path of light emitted from the light emission portion 220 may vary while passing through the refractive layer 240.

For example, light may be emitted from the light emission portion 220 in multi-directions. Here, optical paths of the light may vary when the light transmits through the protective layer 242. In particular, when the light transmits through the protective layer 242, the light may be refracted toward side surfaces of the second substrate 230. The above refracted light may be sensed as straight light by the viewer watching the display device 200 from the side portion of the second substrate 230.

Also, when the viewer watches the light emission portion 220 via the second substrate 230, the point where the viewer watches may be refracted since the light is refracted while passing through the second substrate 230 and the protective layer 242. In particular, although the viewer watches the display device 200 from the side portion of the second substrate 230, the viewer may feel as if he/she watches each of the pixels formed on the light emission portion 220.

Therefore, the display device 200 may ensure visibility for the viewer even when the viewer watches the display device 200 from side portions. In particular, since the viewer may watch clear images from the side portions of the display device 200, the viewing angle may be improved. Also, since the refractive layer 240 of the display device 200 may have a simple structure, manufacturing costs may be reduced and manufacturing time may be reduced so as to simplify manufacturing processes.

According to example embodiments, the display characteristics, e.g., an increased viewing angle, for a viewer may be improved, even when the viewer is positioned at side portions of the display device. In particular, the viewer may watch clear images from the side portions, thereby having an improved viewing angle. In addition, since the refractive layer is formed to have a simple structure, manufacturing time and costs may be reduced.

In contrast, a conventional display device may include either an additional apparatus for correcting image quality electronically in order to increase a viewing angles or a viewing angle compensation film. However, the apparatus for correcting image quality electronically may require an additional complex structure or a complicated controlling method, and the viewing angle compensation film is expensive and may require additional manufacturing time and costs.

While the example embodiments has been particularly shown and described with reference to exemplary embodiments thereof, it will be understood by those of ordinary skill in the art that various changes in form and details may be made therein without departing from the spirit and scope of the example embodiments as defined by the following claims.

What is claimed is:

1. A display device, comprising:
   a first substrate;
   a light emission portion on the first substrate, the light emission portion to output an image to be displayed;
   a second substrate separated by a predetermined distance from the light emission portion, the second substrate to transmit the image to be displayed; and
   a refractive layer on the second substrate, the refractive layer facing the light emission portion and being configured to change an optical path of the image to be displayed emitted from the light emission portion to be directed toward side surfaces of the second substrate by including refractive protrusions protruding from the second substrate toward the light emission portion, the refractive protrusions being spaced apart from the light emission portion,
   wherein the light emission portion includes an organic light-emitting device.

2. The display device of claim 1, wherein the refractive layer includes refractive protrusions, the refractive protrusions being shaped as convex lenses and including a same material as the second substrate.

3. The display device of claim 1, wherein the refractive layer includes:
  a bead layer on the second substrate, the bead layer including sprayed beads; and
  a protective layer on the bead layer.

4. The display device of claim 3, wherein the beads include at least one of glass powder, silica, and ceramic.

5. The display device of claim 3, wherein the protective layer includes at least one of epoxy and silicon.

6. The display device of claim 3, wherein the protective layer has a refractive index lower than a refractive index of the second substrate.

7. The display device of claim 3, wherein the refractive index of the protective layer is 1.5 or less.

8. The display device of claim 3, wherein each of the beads has a diameter of about 3 μm to about 5 μm.

9. The display device of claim 3, wherein a haze of the beads sprayed on the second substrate ranges from about 30% to about 50%.

10. The display device of claim 3, wherein the protective layer is formed as hemispheres.

11. The display device of claim 3, wherein each bead has a lens shaped thereon.

12. The display device of claim 1, wherein the beads are separated from each other on a surface of the second substrate.

13. The display device of claim 12, wherein the protective layer is shaped as a plurality of convex lenses that are separated from each other on a surface of the second substrate.

14. The display device of claim 1, wherein the display device is an organic light emitting display device.

15. A method of manufacturing a display device, the method comprising:
  forming a light emission portion on a first substrate, the light emission portion to output an image to be displayed;
  forming a refractive layer on a second substrate, the second substrate to transmit the image to be displayed; and
  attaching the first substrate to the second substrate, such that the refractive layer faces the light emission portion,
  wherein the refractive layer is configured to change an optical path of the image to be displayed emitted from the light emission portion to be directed toward side surfaces of the second substrate by including refractive protrusions protruding from the second substrate toward the light emission portion, the refractive protrusions being spaced apart from the light emission portion.

16. The method of claim 15, wherein forming the refractive layer includes:
  coating a surface of the second substrate with glass powder; and
  etching the coated surface of the second substrate.

17. The method of claim 15, wherein the refractive protrusions are formed of a same material as the second substrate.

18. The method of claim 15, wherein forming the refractive layer includes:
  forming a bead layer on the second substrate; and
  forming a protective layer on the bead layer.

19. The method of claim 18, wherein forming the protective layer includes passivating the protective layer by hardening epoxy with ultraviolet (UV) light or forming the protective layer with a silicon on glass (SOG) process.

20. The method of claim 18, wherein the protective layer is formed as hemispheres.

* * * * *